(12) United States Patent
Cheriton et al.

(10) Patent No.: US 8,504,791 B2
(45) Date of Patent: *Aug. 6, 2013

(54) HIERARCHICAL IMMUTABLE CONTENT-ADDRESSABLE MEMORY COPROCESSOR

(71) Applicant: Hicamp Systems, Inc., Menlo Park, CA (US)

(72) Inventors: David R. Cheriton, Palo Alto, CA (US); Alexandre Y. Solomatnikov, Palo Alto, CA (US)

(73) Assignee: Hicamp Systems, Inc., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/629,183

(22) Filed: Sep. 27, 2012

(65) Prior Publication Data

US 2013/0031331 A1 Jan. 31, 2013

Related U.S. Application Data

(63) Continuation-in-part of application No. 13/533,125, filed on Jun. 26, 2012, which is a continuation of application No. 13/271,137, filed on Oct. 11, 2011, now Pat. No. 8,230,168, which is a continuation of application No. 12/653,889, filed on Dec. 17, 2009, now Pat. No. 8,065,476, which is a continuation of application No. 12/011,311, filed on Jan. 25, 2008, now Pat. No. 7,650,460, application No. 13/629,183, which is a continuation of application No. 12/784,268, filed on May 20, 2010.

(60) Provisional application No. 60/897,773, filed on Jan. 26, 2007.

(51) Int. Cl.
*G06F 12/00* (2006.01)

(52) U.S. Cl.
USPC .......... 711/167; 711/105; 711/147; 711/156; 711/202; 707/649; 345/503; 345/530; 345/541; 345/543; 345/556; 345/557; 345/564; 345/568

(58) Field of Classification Search
USPC .......... 711/167, 105, 147, 156, 202; 707/649; 345/503, 530, 541, 543, 556, 557, 564, 568
See application file for complete search history.

(56) References Cited

U.S. PATENT DOCUMENTS

| | | |
|---|---|---|
| 5,459,690 A | 10/1995 | Rieger et al. |
| 5,625,813 A | 4/1997 | Venn |
| 5,822,749 A | 10/1998 | Agarwal |

(Continued)

OTHER PUBLICATIONS

Inenaga et al., On-Line Construction of Compact Directed Acyclic Word Graphs, Published in Journal: Discrete Applied Mathematics, vol. 146, Issue 2, Mar. 2005, pp. 156-179, Elsevier Science Publishers B.V. Amsterdam, The Netherlands (attached document pp. 1-36).

(Continued)

*Primary Examiner* — Stephen Elmore
(74) *Attorney, Agent, or Firm* — Van Pelt, Yi & James LLP

(57) ABSTRACT

Intercepting a requested memory operation corresponding to a conventional memory is disclosed. The requested memory operation is translated to be applied to a structured memory.

40 Claims, 6 Drawing Sheets

U.S. PATENT DOCUMENTS

| | | | |
|---|---|---|---|
| 6,449,667 | B1 | 9/2002 | Ganmukhi et al. |
| 6,453,403 | B1 | 9/2002 | Czajkowski |
| 6,789,156 | B1 | 9/2004 | Waldspurger |
| 6,848,029 | B2 | 1/2005 | Coldewey |
| 6,934,796 | B1 | 8/2005 | Pereira et al. |
| 7,096,322 | B1 | 8/2006 | Sollom et al. |
| 7,245,623 | B1 * | 7/2007 | Cheriton ............. 370/393 |
| 7,254,748 | B1 | 8/2007 | Wright et al. |
| 7,257,693 | B2 | 8/2007 | Newburn et al. |
| 7,269,542 | B2 * | 9/2007 | Ruetsch ............. 703/22 |
| 7,650,460 | B2 | 1/2010 | Cheriton |
| 7,773,676 | B2 * | 8/2010 | Chung ............. 375/240.25 |
| 8,065,476 | B2 | 11/2011 | Cheriton |
| 2002/0133668 | A1 | 9/2002 | Sherman |
| 2003/0093616 | A1 | 5/2003 | Slavin |
| 2003/0131348 | A1 | 7/2003 | Hogstrom et al. |
| 2003/0135641 | A1 * | 7/2003 | Cheriton ............. 709/238 |
| 2003/0236961 | A1 | 12/2003 | Qiu et al. |
| 2004/0107312 | A1 * | 6/2004 | Ruetsch ............. 711/113 |
| 2004/0186840 | A1 | 9/2004 | Dettinger et al. |
| 2005/0065955 | A1 | 3/2005 | Babikov et al. |
| 2006/0155875 | A1 * | 7/2006 | Cheriton ............. 709/245 |
| 2007/0022246 | A1 | 1/2007 | Regev et al. |
| 2009/0112880 | A1 | 4/2009 | Oliveira et al. |
| 2009/0164754 | A1 | 6/2009 | Cheriton |
| 2011/0010347 | A1 | 1/2011 | Cheriton et al. |
| 2011/0238917 | A1 | 9/2011 | Lin et al. |
| 2013/0024645 | A1 * | 1/2013 | Cheriton et al. ............. 711/206 |
| 2013/0031331 | A1 * | 1/2013 | Cheriton et al. ............. 711/206 |

OTHER PUBLICATIONS

Chang et al., Bigtable: A Distributed Storage System for Structured Data, Published in: OSDI '06 Proceedings of the 7th USENIX Symposium on Operating Systems Design and Implementation, pp. 205-218, Nov. 2006, vol. 7, (attached document pp. 1-14).

Walpole et al., Maintaining Consistency in Distributed Software Engineering Environments, 1998, pp. 418-425, 8th International Conference on Distributed Computing Systems.

* cited by examiner

HIERARCHICAL IMMUTABLE CONTENT-ADDRESSABLE MEMORY COPROCESSOR

CROSS REFERENCE TO OTHER APPLICATIONS

This application is a continuation in part of co-pending U.S. patent application Ser. No. 13/533,125 entitled HIERARCHICAL IMMUTABLE CONTENT-ADDRESSABLE MEMORY PROCESSOR filed Jun. 26, 2012 which is a continuation of U.S. patent application Ser. No. 13/271,137, now U.S. Pat. No. 8,230,168, entitled HIERARCHICAL IMMUTABLE CONTENT-ADDRESSABLE MEMORY PROCESSOR filed Oct. 11, 2011 which is a continuation of U.S. patent application Ser. No. 12/653,889, now U.S. Pat. No. 8,065,476, entitled HIERARCHICAL IMMUTABLE CONTENT-ADDRESSABLE MEMORY PROCESSOR filed Dec. 17, 2009, which is a continuation of U.S. patent application Ser. No. 12/011,311, now U.S. Pat. No. 7,650,460, entitled HIERARCHICAL IMMUTABLE CONTENT-ADDRESSABLE MEMORY PROCESSOR filed Jan. 25, 2008, which are incorporated herein by reference for all purposes, which claims priority to U.S. Provisional Application No. 60/897,773, entitled HIERARCHICAL IMMUTABLE CONTENT-ADDRESSABLE MEMORY PROCESSOR filed Jan. 26, 2007 which is incorporated herein by reference for all purposes; and a continuation of co-pending U.S. patent application Ser. No. 12/784,268 entitled STRUCTURED MEMORY COPROCESSOR filed May 20, 2010 which all are incorporated herein by reference for all purposes.

BACKGROUND OF THE INVENTION

Efficient, concurrency-safe access to shared data is an important concern for effective software use of multi-core processors. Advances in structured memory systems and processors address this concern, but many applications already exist and continue to be written for conventional processor and memory systems. It would be useful if the benefits of a structured memory system could be enjoyed without requiring extensive work to redesign existing systems and software.

BRIEF DESCRIPTION OF THE DRAWINGS

Various embodiments of the invention are disclosed in the following detailed description and the accompanying drawings.

DETAILED DESCRIPTION

Figure 1:
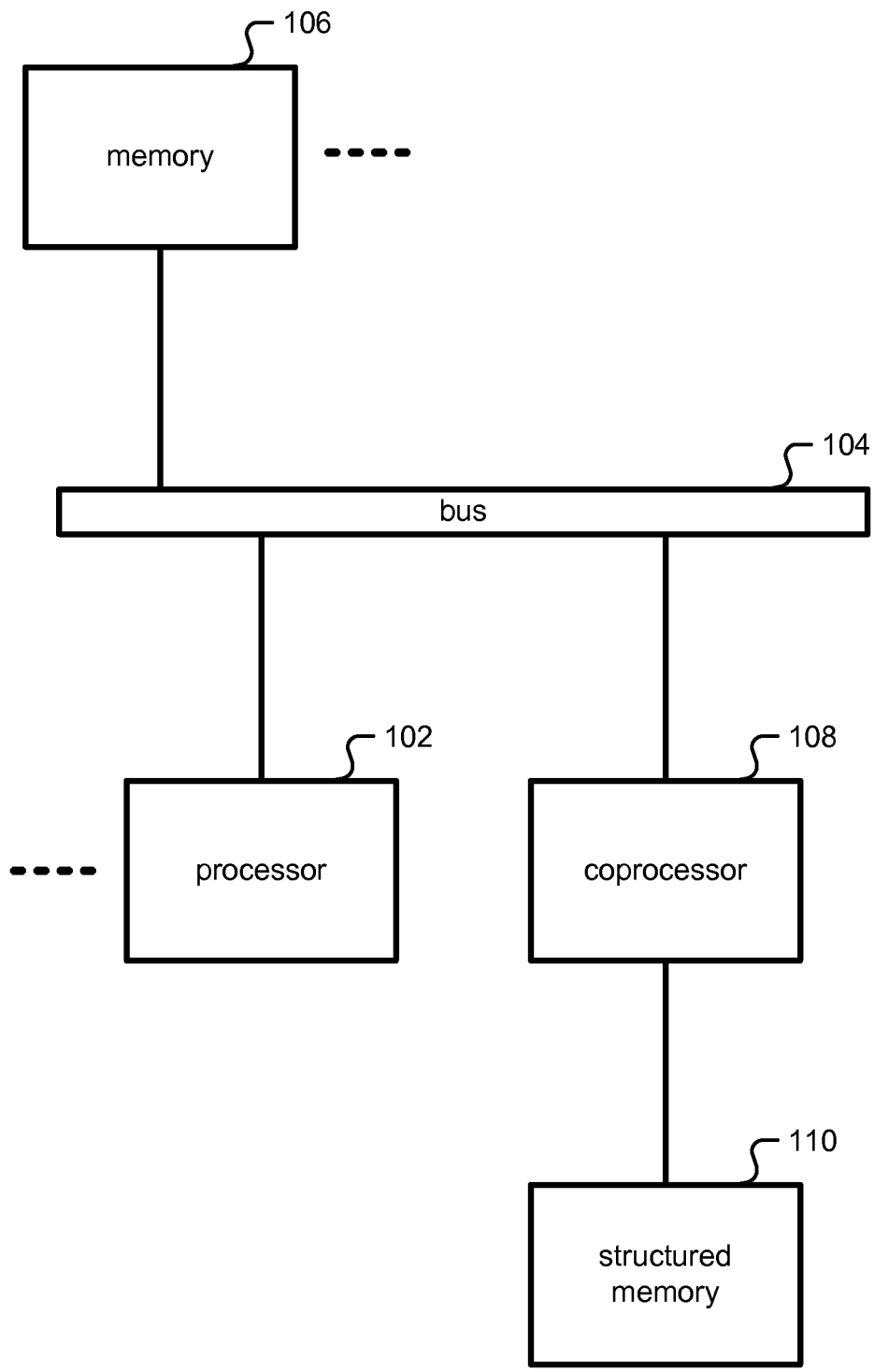
FIG. 1 is a block diagram illustrating an embodiment of a system for a structured memory coprocessor.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Efficient, concurrency-safe access to shared data is an important concern for effective software use of multi-core processors. Much of the focus in this area has been on the multithreaded model, where multiple threads within a single address space concurrently access shared data in the memory. However, this multithreaded shared memory model can become non-deterministic because of arbitrary interleaving of threads accessing shared memory. The software developer's job is to avoid non-determinism by carefully orchestrating accesses to shared data using mechanisms such as locks or monitors. This extra requirement complicates development of parallel software, compared to sequential development programming.

In practice, a common and more scalable software approach is to partition the application system into multiple separate client processes and one or more shared state-managing processes, connected by inter-process communication ("IPC") mechanisms such as sockets. For example, a web site may be implemented as multiple web server processes accessing shared state stored in a database server, running as a separate process. While the database provides data consistency and persistence, it does not have sufficient read bandwidth for many popular high-traffic web-sites. To improve the throughput, one or more instances of a memcached server process are used to cache results of the database queries and common parts of dynamically generated web pages in memory. A similar structure holds for many web applications as well as database applications and database management systems.

The multi-process structure provides strong fault-isolation between the client processes and the servers, preventing the clients from corrupting the shared state, even if a flaw in the client code causes a sudden restart. It also reduces the degree of concurrency in the code that is responsible for updating the shared state, allowing better control over the contention on locks and shared data, as well as simplifying the software.

Furthermore, it allows the application to scale seamlessly across a cluster of networked processors.

However, the biggest disadvantage of this approach is the communication overhead. For example, to lookup a key in a key-value pair ("KVP") mapping implemented by memcached, a client process needs to generate a message containing the desired key, transmit the message over the socket connection to the memcached server, and then wait while the server retrieves the message from its socket, extracts the key and transforms it back to the internal representation, looks up the key in the mapping, and then generates a message containing the value and writes it to the socket that transmits back the response. Thus, considering the total cycles and total number of memory accesses, the KVP lookup itself is a fraction of the overall cost of the client query process.

Using conventional, for example Gigabit Ethernet, connections to connect processors, this overhead of data sharing is significant but accepted as a necessary evil to achieve fault-tolerance and scalability. However, with multi-core processors, using the same software structure can lead to a significant amount of the memory traffic and data duplication due to this "local" socket communication between address spaces. For instance, with 80 cores on a chip, a web site could run multiple web servers, a memcached server or two and a database server on the same chip, spread across the cores, resulting in multiple copies of the same data in different address spaces and socket buffers.

Structured memory provides an alternative to both shared memory and IPC models. For example, there exist structured memory models that provide this alternative by implementing an abstraction of immutable, copy-on-write memory. This abstraction allows efficient, fault-tolerant, concurrency-safe access to shared data by multiple threads or processes without requiring socket/network communication between separate address spaces, or locking/synchronization mechanisms in multithreaded model. To reduce the cost of multiple copies or versions of the same data, some implementations of structured memory implements automatic data deduplication and compaction. This reduces memory footprint and improves the memory system performance even for running legacy software.

Capabilities of structured memory systems may be conceptually similar to Snapshot Isolation implemented in many database management systems, which allows long running, read-only transactions to be executed without overhead of serialization. For example, consider the task of calculating the balance of all bank accounts by bank database for audit or management purposes. Such calculation requires long iteration over all accounts, where state must be consistent, yet it should not block on-going account transfer transactions. Snapshoting allows performing such calculations without serialization and long pauses. Similarly, most of memcached requests are reads from key-value-pair map that can be executed using a snapshot of the map without synchronization.

Using a coprocessor on a memory bus/interconnect to interface a processor with a structured memory is disclosed. Throughout this specification, the coprocessor may be referred to interchangeably as "SITE". One example of the structured memory system/architecture is "HICAMP" as described in U.S. Pat. No. 7,650,460 which is hereby incorporated by reference in its entirety.

HICAMP provides fine-grain efficient atomic snapshot and update semantics on memory segments, as well as efficient representation of associated arrays and sparse matrices. However, to achieve all these benefits in full, a new or revised instruction set architecture is needed, requiring a new processor and compiler and run-time environment/operating system.

Some of the benefits of HICAMP can be provided to a conventional processor/system by providing HICAMP capabilities as a specialized coprocessor and providing regions of the physical address space with read/write access to HICAMP memory by the conventional processors and associated operating system.

This direction is facilitated by several modern processors being designed with shared memory processor ("SMP") extensibility in the form of a memory-coherent high-performance external bus. Throughout this specification "interconnect" refers broadly to any inter-chip bus, on-chip bus, point-to-point links, point-to-point connection, multi-drop interconnection, electrical connection, interconnection standard, or any subsystem to transfer signals between components/subcomponents. Throughout this specification "bus" and "memory bus" refers broadly to any interconnect. For example, the AMD Opteron processor supports the coherent HyperTransport™ ("cHT") bus and Intel processors support the QuickPath Interconnect™ ("QPI") bus. This facility allows a third party chip to participate in the memory transactions of the conventional processors, responding to read requests, generating invalidations and handling write/write-back requests. This third party chip only has to implement the processor protocol; there is no restriction on how these operations are implemented internal to the chip.

SITE exploits this memory bus extensibility to provide some of the benefits of HICAMP without requiring a full processor with the software support/tool chain to run arbitrary application code SITE may appear as a specialized processor which supports one or more execution contexts plus an instruction set for acting on a structured memory system that it implements. In some embodiments, each context is exported as a physical page, allowing each to be mapped separately to a different process, allowing direct memory access subsequently without OS intervention yet providing isolation between processes. Within an execution context, SITE supports defining one or more regions, where each region is a consecutive range of physical addresses on the memory bus.

Each region maps to a structured memory physical segment. As such, a region has an associated iterator register, providing efficient access to the current segment. The segment also remains referenced as long as the physical region remains configured. These regions may be aligned on a sensible boundary, such as 1 Mbyte boundaries to minimize the number of mappings required. SITE has its own local DRAM, providing a structured memory implementation of segments in this DRAM.

In the HICAMP example, SITE supports a segment map indexed by virtual segment id ("VSID"), where each entry points to the root physical line identification ("PLID") of a segment plus flags indicating merge-update, etc. Each iterator register records the VSID of the segment it has loaded and supports conditional commit of the modified segment, updating the segment map entry on commit if it has not changed. If flagged as merge-update, it attempts a merge. Similarly, a region can be synched to its corresponding segment, namely to the last committed state of the segment. The segment table entry can be expanded to hold more previous segments as well as statistics on the segment. VSIDs have either system-wide scope or else scope per segment map, if there are multiple segment maps. This allows segments to be shared between processes. SITE may also interface to a network interconnect such as Infiniband to allow connection to other nodes. This allows efficient RDMA between nodes, including remote checkpoints. SITE may also interface to FLASH memory to allow persistence and logging.

In some embodiments, a basic model of operation is used where SITE is the memory controller and all segment management operations (allocation, conversion, commit, etc.) occur implicitly and are abstracted away from software.

FIG. 1 is a block diagram illustrating an embodiment of a system for a structured memory coprocessor. In the example shown, processor 102 is coupled to bus 104, which is itself coupled to a memory 106 and coprocessor 108. Coprocessor 108 is also coupled to a structured memory 110. In some embodiments (not shown), the structured memory 110 is a subset of memory 106, and coupled to coprocessor 108 through the bus 104. There may be a plurality of processors and/or memories.

Processor 102 may be any processor with an established instruction set architecture; for example the Intel Xeon™, AMD Opteron™, or another processor with the Intel x86™ instruction set architecture. Bus 104 may be any memory bus, including a memory-coherent high-performance external bus; for example, the AMD cHT bus and Intel QPI bus. Memory 106 may be any form of storage of state, for example non-volatile or volatile memory, dynamic or static memory, or any memory of varying mutability, accessibility, performance or capacity. Two examples of memory 106 include a dynamic random-access memory ("DRAM") used for per processor or system-wide primary storage or a static random-access memory ("SRAM") for processor or system-wide caching. Coprocessor 108, for example SITE, gives processor 102 access to structured memory 110, for example HICAMP. In some embodiments (not shown), SITE implements structured memory within memory 106 instead of having a dedicated memory shown as 110 in FIG. 1.

In some embodiments, SITE is implemented effectively as a version of a HICAMP processor, but extended with a network connection, where the line read and write operations and "instructions" are generated from requests over a Hyper Transport bus rather than local processor cores. The combination of the Hyper Transport bus interface module and region mapper simply produces line read and write requests against an iterator register, which then interfaces to the rest of the HICAMP memory system/controller 110. In some embodiments, coprocessor 108 extracts VSIDs from the (physical) memory address of the memory request sent by the processor 102.

In some embodiments, SITE includes a processor/microcontroller to implement, for example, notification, merge-update, and configuration in firmware, thus not requiring hard logic.

Each SITE context is assigned a separate page location in the physical address space so it can be allocated and mapped by the operating system ("OS"), thereby allowing the process to write directly. Thus, an OS process is coupled to a SITE context and can only perform instructions on the regions/iterator registers within that context. In this way, protection between processes is preserved in SITE.

Each of the iterative operations, for example indexed-join or make-inverted-index, can be implemented as a firmware-driven iteration using basic HICAMP operations. This is in contrast to a dedicated HICAMP processor, where iterative operations are implemented by a loop instruction, looping over the basic instructions to read and write through iterator registers.

Notifications are generated by the iterator register comparing lines against the previous segment, as required for merge-update. If a line differs from the previous segment, for example it is currently committed; a notification record is queued for each processor that is interested. A merged line is produced if the segment is flagged as merge-update and the new and old lines can be merged. In some embodiments this can be defined as a "weak reference" as disclosed in related U.S. Patent Application 61/273,177, which is hereby incorporated by reference in its entirety.

Figure 2A:
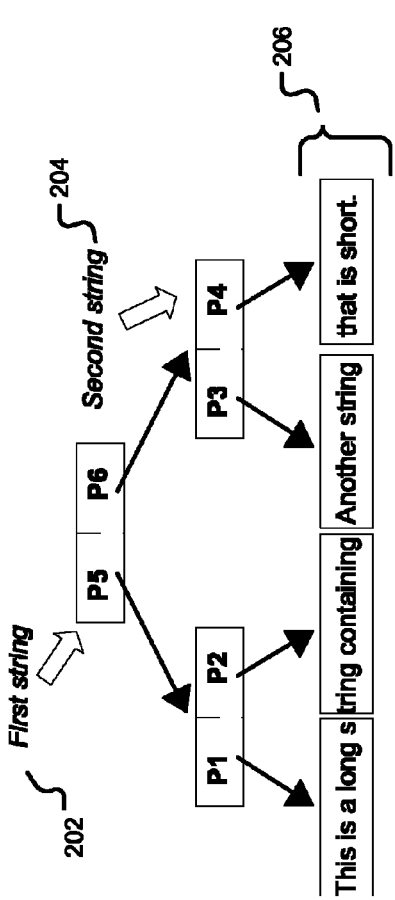
FIGS. 2A and 2B are illustrations of an embodiment of a structured memory.
Figure 2B:
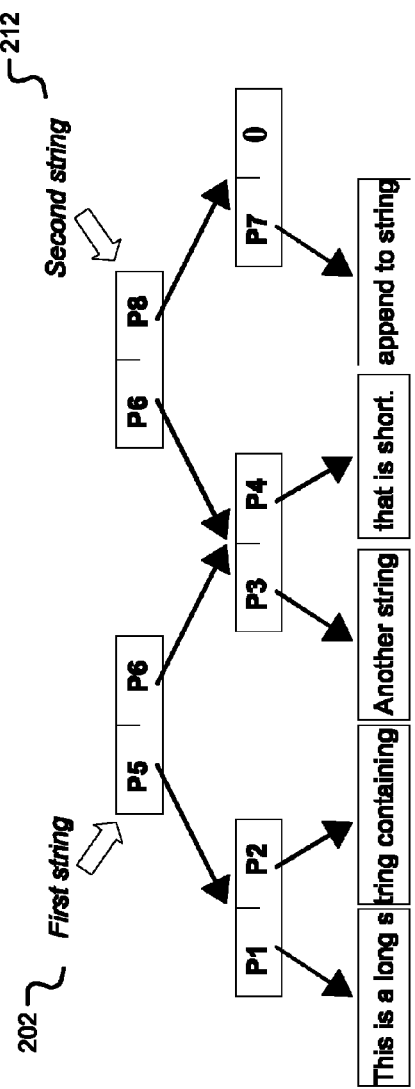

FIGS. 2A and 2B are illustrations of an embodiment of a structured memory. In some embodiments, the system of FIGS. 2A and 2B are included in structured memory 110. The example given is of SITE with HICAMP, but without limitation coprocessor 108 may be designed for other structured memory 110.

Efficient concurrency-safe access to shared data is a key concern for the effective software use of multi-core processors. The HICAMP architecture includes an innovative memory system supporting efficient, fault-tolerant, concurrency-safe access to structured shared data without incurring the overhead of inter-process communication. The HICAMP architecture is based on the following key ideas:

1. content-unique lines: memory is an array of small fixed-size lines, each addressed by a PLID, with each line in memory having a unique content that is immutable over its lifetime.

2. memory segments and segment map: memory is accessed as a number of segments, where each segment is structured as a directed acyclic graph ("DAG") of memory lines. Seg segment table maps each segment to the PLID that represents the root of the DAG. Segments are identified and accessed by segment identifiers ("SegID".)

3. iterator registers: special-purpose registers in the processor allow efficient access to data stored in the segments, including loading data from the DAG, iteration, prefetching and updates of the segment contents.

Content-Unique Lines

HICAMP memory is divided into lines, each with a fixed size, for example 16, 32 or 64 bytes. Each line has a unique content that is immutable during its life time. Uniqueness and immutability of lines is guaranteed and maintained by a duplicate suppression mechanism in the memory system. In particular, the memory system can either read a line by its PLID, similar to a read operation in a conventional memory system, as well as look up by content, instead of writing. Look up by content operation returns a PLID for the memory line, allocating a line and assigning it a new PLID if such content was not present before. When the processor needs to modify a line, to effectively write new data into memory, it requests a PLID for a line with the specified/modified content.

In some embodiments, PLIDs are a hardware-protected data type to ensure that software cannot create them directly. Each word in the memory line and processor registers has tags which indicate whether it contains a PLID and software is precluded from directly storing a PLID in a register or memory line. In some embodiments, the tags for words in the memory lines are stored in the ECC bits, using bits that are not strictly needed for adequate ECC, for example commodity DRAM chips with ECC contain 8 ECC bits per 64-bit of data yet for 16-byte lines 9 ECC bits are sufficient to implement standard single-error-correcting-double error-detecting ("SEC-DED") code, leaving 7 bits to store the tags.

Consequently, HICAMP provides protected references in which an application thread can only access content that it has created or for which the PLID has been explicitly passed to it.

Segments

A variable-sized, logically contiguous block of memory in HICAMP is referred to as a "segment" and is represented as a DAG constructed of fixed size lines as illustrated in FIG. 2A.

FIG. 2A shows two memory segments 202 and 204 representing two strings, the second one 204 being a substring of the first 202. Note that the second string shares all the lines of the first string, given the latter is a substring of the former. The data elements are stored at the leaf lines 206 of the DAG.

Each segment follows a canonical representation in which leaf lines are filled from the left to right. As a consequence of this rule and the duplicate suppression by the memory system, each possible segment content has a unique representation in memory. In particular, if the character string of FIG. 2A is instantiated again by software, the result is a reference to the same DAG which already exists. In this way, the content-uniqueness property is extended to memory segments. Furthermore, two memory segments in HICAMP can be compared for equality in a simple single-instruction comparison of the PLIDs of their root lines, independent of their size.

When contents of a segment are modified by creating a new leaf line, the PLID of the new leaf replaces the old PLID in the parent line. This effectively creates new content for the parent line, consequently acquiring a new PLID for the parent and replacing it in the level above. Continuing this operation, new PLIDs replace the old ones all the way up the DAG until a new PLID for the root is acquired.

Each segment in HICAMP is "copy-on-write" because of the immutability of the allocated lines; that is, a line does not change its content after being allocated and initialized until it is freed because of the absence of references to it. Consequently, passing the root PLID for a segment to another thread effectively passes this thread a snapshot and a logical copy of the segment contents. Exploiting this property, concurrent threads can efficiently execute with "snapshot isolation"; each thread simply needs to save the root PLID of all segments of interest and then reference the segments using the corresponding PLIDs. Therefore, each thread has sequential process semantics in spite of concurrent execution of other threads.

A thread in HICAMP uses non-blocking synchronization to perform safe, atomic update of a large segment by:
1. saving the root PLID for the original segment;
2. modifying the segment updating the contents and producing a new root PLID; and
3. using a compare-and-swap ("CAS") instruction or similar to atomically replace the original root PLID with the new root PLID, if the root PLID for the segment has not been changed by another thread, and optionally otherwise retrying as with conventional CAS.

In effect, the inexpensive/logical copy and copy-on-write in HICAMP makes Herlihy's theoretical construction showing CAS as sufficient actually practical to use in real applications. Because of the line-level duplicate suppression, HICAMP maximizes the sharing between the original copy of the segment and the new one. For example, if the second string in FIG. 2A was modified to add the extra characters "append to string", the memory as shown in FIG. 2B then contains the segment 212 corresponding to the second string, sharing all the lines of the original segment, and simply extends with additional lines to store the additional content and the extra internal lines necessary to form the DAG.

Segment Map

A HICAMP segment is referenced in software using a SegID, that is mapped to the corresponding PLID, through a segment map. This map is implemented in the conventional part of the memory, indexed by SegID with each entry containing:

[rootPLID,height,flags]

and fitting into a single memory line. The rootPLID indicates the physical line ID for the root node of the segment DAG and the height indicates the height or logical height. Flags are used to indicate read-only access, merge-update or to indicate a weak reference, for example, ones that should be zeroed when the segment is reclaimed, rather than prevent its reclamation. Each word in the line is further tagged as being a SegID or PLID.

Objects at the software level are mapped into distinct segments, where the object data is stored in the leaves of the DAG representing the segment. Other objects referring to this object, say O1, store its corresponding SegID, S1. When the contents of O1 are updated, the entry in the segment map corresponding to S1 is updated to point to the new rootPLID of its DAG, and thus the other referencing objects do not have to change their references.

To some degree, this mapping acts as a fine-grain page table and virtual memory mechanism in a conventional architecture. However, the "address translation" only occurs on the first access to the segment, not on every access to each data element. In this vein, there is no need for conventional address translation in HICAMP because inter-process isolation is achieved by the protected references. In particular, a process can only access data that it creates or it is passed a reference to. Moreover, a reference such as a SegID can be passed as read-only, restricting the process from updating the rootPLID in the corresponding segment map entry. Thus, a thread can efficiently share objects with another threads by simply passing the SegID, while ensuring that the other threads cannot modify the object, achieving the same protection as separate address spaces but without the interprocess address copying, marshaling and demarshaling and duplication forced by conventional virtual memory systems.

In HICAMP, memory accesses go through special registers referred to as iterator registers. An iterator register effectively points to a data element in a segment. It caches the path through the segment from the root PLID of the DAG to the element it is pointing to, as well as element itself, ideally the whole leaf line. Thus, an ALU operation that specifies a source operand as an iterator register accesses the value of the current element the same way as a conventional register operand. The iterator register also allows its current offset, or index within the segment, to be read.

Iterator registers support a special increment operation that moves the iterator register's pointer to the next or next non-null element in the segment. In HICAMP, a leaf line that contains all zeroes is a special line and is always assigned PLID of zero. Thus, an interior line that references this zero line is also identified by PLID zero. Therefore, the hardware can easily detect which portions of the DAG contain zero elements and move the iterator register's position to the next non-zero memory line. Moreover, caching of the path to the current position means that the register only loads new lines on the path to the next element beyond those it already has cached. In the case of the next location being contained in the same line, no memory access is required to access the next element.

Using the knowledge of the DAG structure, the iterator registers can also automatically prefetch memory lines in response to sequential accesses to elements of the segment. Upon loading the iterator register, the register automatically prefetches the lines down to and including the line containing the data element at the specified offset.

In one embodiment, when a coprocessor-mapped memory segment is updated, cache lines in the conventional cache must be invalidated. A structured memory coprocessor can use iterator registers and snapshotting capability to iterate over the segment and evict only the cache lines that have changed. In some embodiments, a structured memory 110 for coprocessor 108 may be represented as a graph but not be deduplicated: one example is Fresh Breeze.

In some embodiments, the structured memory 110 may include one or more of the following:

lines: memory is an array of small fixed-size lines, each addressed by variable-size line ID;

deduplication: at most one line in the system contains a given data value;

immutability: software cannot write memory, it can only request a line with given contents;

the iterator register: structured data access and commit thru iterators;

memory as a collection of variable-sized segments, with load and store thru iterator registers;

snapshot semantics on segment access;

atomic update on iterator commit;

fixed-size so no memory fragmentation;

cache memory to cover deduplication in last level cache ("LLC")/main memory;

deduplication and compaction so less memory is used up; and refcounted for auto-reclamation.

In summary, using a structured memory 110 eliminates the cost of IPC to a separate process, providing direct memory access to database state, but still providing protection of data and sharing. It also provides hardware non-blocking concurrency so minimal synchronization overhead is incurred. It also provides hardware support for complex processing such as inverted indexes and joins. Thus, structured memory 110 provides:

hardware supported direct memory access to database state without the risk of corruption;

hardware supported atomic update and snapshot of state for lock-free execution; and hardware supported tables, inverted indexes, joins and memory management.

Core performance-critical database software structures are supported in hardware using structured memory techniques, for example with HICAMP shared segments the benefits include:

associative arrays, lists, inverted indexes, shared strings, queues, sparse matrices being stored in hardware, not software;

zero-cost snapshot copy and efficient atomic update;

merge-update for concurrent updates; and each coprocessor 108 region maps to a shared segment.

In one embodiment, the HICAMP memory model provides:

immutable content-addressable lines;

canonical DAG representation of a segment;

deduplicated representation: the same content has the same DAG;

sharing between DAGs, for example checkpoints of a same segment;

the iterator register, resulting in efficient DAG access with smart prefetch and caching;

automatic memory compaction by deduplication and line/path compaction; and protected references and structures for isolation from software faults and hardware memory reclamation.

Figure 3A:
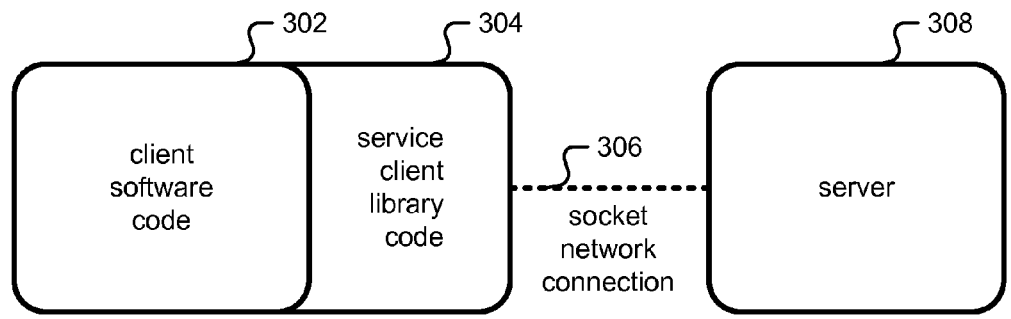
FIGS. 3A and 3B are illustrations of an embodiment of the software client without and with a coprocessor.
Figure 3B:
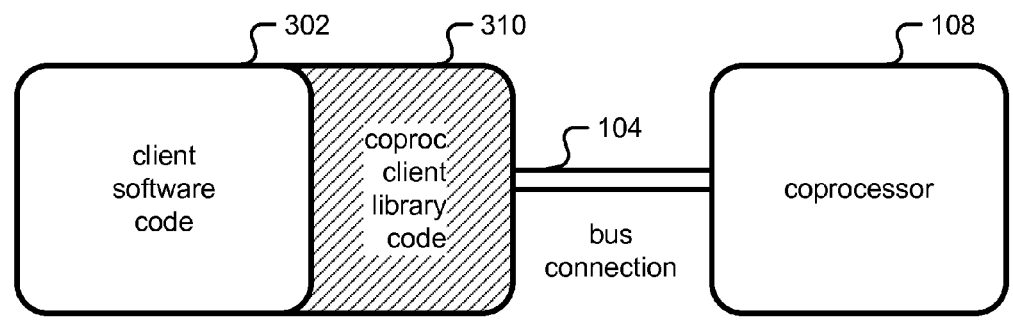

FIGS. 3A and 3B are illustrations of an embodiment of a software client without and with a coprocessor, respectively. In some embodiments the system depicted in FIG. 1 executes the software client of FIG. 3A or 3B directly or indirectly.

Recall the example of the IPC client/server model, represented in FIG. 3A. One example of the IPC client/server model is a memcached server process used to cache results of database queries and/or common parts of dynamically generated web pages in memory. The client application includes client software code 302 and service client library code 304. The developer of client software executable 302 uses the library 304 to establish a socket network connection 306 over a network to the server 308.

The communication overhead generated by IPC is large. For example and as described earlier, to lookup a key in a KVP mapping implemented by memcached, a client process 302 needs to generate a message containing the desired key, transmit the message over the socket connection 306 to the memcached server 308, wait while the server 308 retrieves the message from its socket 306, extracts the key and transforms it back to the internal representation, looks up the key in the mapping, and then generates a message containing the value and writing it to the socket 306 that transmits back the response to client 302. Thus, considering the total cycles and total number of memory accesses, the KVP lookup itself is a small fraction of the overall cost of the client query process.

The structured memory coprocessor alternative is represented in FIG. 3B. The identical client software code 302 is used to preserve the client developer's time in development, with the development only focused on the addition of new library code, coprocessor client library code 310. After recompiling the client comprised of software code 302 and library code 310, the client then uses a bus connection 104 to coprocessor 108.

Even comparing the theoretical maximum throughput of network 306, for example Gigabit Ethernet at 1 Gbps/10 Gbps, with bus 104, for example QPI at 25.6 GBps, shows more than an order of magnitude improvement on communications overhead. The performance of the basic lookup/simple query database operations benefit primarily because of avoiding the interprocess communication cost. The more complex operations are efficient because of the iterator/DA benefits for inverted indexes, and the fact that the cost of communicating with SITE is amortized over these iterative operations, such as "join".

Figure 4:
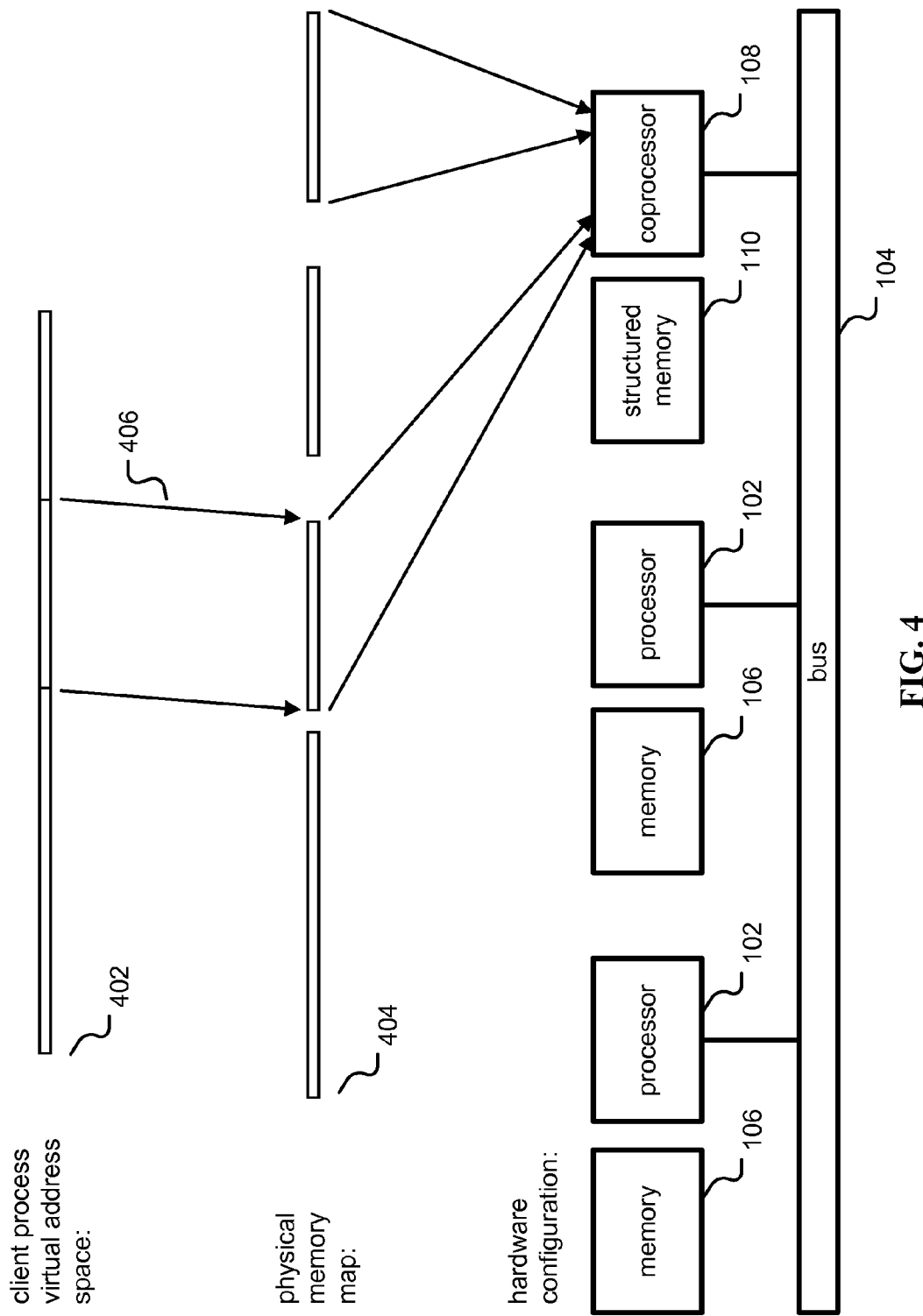
FIG. 4 is an illustration of an embodiment of memory-mapped access to a structured memory coprocessor.

FIG. 4 is an illustration of an embodiment of memory-mapped access to a structured memory coprocessor. In some embodiments, the access depicted in FIG. 4 is an application programmer's interface ("API") established by one or more of the following: the operating system, the developer and the coprocessor designers. In some embodiments (not shown), the memory region is not mapped to a coprocessor: for example, the memory region can be mapped to DRAM attached to the processor and the coprocessor can snoop over the bus/interconnect for changes in order to do memory snapshotting.

Coprocessor 108 supports an instruction execution mechanism using an execution context page, written with memory-mapped access. In some embodiments this causes SITE to perform the specified instruction using the iterator registers corresponding to the specified regions. Thus, an application running on processor 102 has an associated client process virtual address space 402, which is mapped to physical memory 404 using conventional OS techniques. Within virtual address space 402, a virtual address region 406 is mapped to a physical memory region 406 which is part of a mapped data region being managed by the coprocessor 108, which handles reads from and writes to that region 406 of physical memory. Coprocessor 108 instructions provide configuration plus the ability to commit/abort/sync regions, create inverted indices and other operations.

Thus, an application can write to a region 406 to cause, for the HICAMP example, the iterator register to contain the appropriate values. The operations include those defined on iterator registers in a full HICAMP processor excluding the ALU operations. Some of these operations are listed below.

In some embodiments, coprocessor 108 supports an instruction to allocate a physical address region of a specified size, as well as the corresponding delete of the physical address region. The coprocessor 108 traps this instruction if not issued in supervisor mode, allowing the operating system to intercede, check that the allocation is allowed, and mapping the physical address region into the process address space if it is allowed and succeeds. The instruction may be issued by an application developer or the operating system.

Once such a region is mapped, when a processor 102 issues a read from a virtual address 402 that maps to a physical address 404 that maps to a given region 406, the coprocessor 108 responds with the data line in the physical segment and at the offset corresponding to this physical address. In particular, if PA is the physical address and falls within a region with start address RSA and end address REA, it is mapped to the line at offset O in segment S, where S is the segment for this region, and O is equal to PA-RSA. Similarly, when a processor 102 issues a write/writeback to a physical address in a region, the coprocessor 108 writes the data at the corresponding segment and offset.

The coprocessor supports a commit operation in which the current segment is committed to memory, converting all associated transient lines to deduplicated lines, and updating the corresponding segment table entry, the same as a full structured memory implementation, including merge-update. Up to the limits of the transient line capacity maintained by the coprocessor 108, writes are maintained as transient lines until the checkpoint. The processor(s) 102 may be forced to write back any dirty data from their caches in advance of this action.

Optionally, coprocessor 108 may include an interface to FLASH, in which case it can flush any new lines to FLASH as part of the commit. Note that only the new lines need to be written to FLASH, and can be appended to the end of the FLASH, matching the preferred log-structured access to FLASH.

The coprocessor 108 also supports an abort operation in which the segment is reverted to that specified in the corresponding segment table entry, discarding any changes in the current segment. This entails reloading the iterator register associated with the region 406 with the old physical segment and causing the conventional processors to invalidate any cache lines that correspond to reverted lines in the current segment. This operation may be referred to as rollback, given its use. Supporting rolling back further involves resetting the segment map entry to an earlier physical segment.

A sync operation on a region 406 causes its physical segment to be a copy of the last committed version, as contained in the corresponding segment table entry. This allows a read-only region to be made consistent with a separate region that is effectively providing the updates, it being coupled by being associated with the same virtual segment entry.

In some embodiments, the coprocessor 108 also supports indirect or associative reading and writing of an array of segments. The array entry is read by writing to an input region starting at offset 0 with the key value and invoking the indirect read operation specifying the array of segments and the input region as the key. This instruction causes the output region iterator to be set to the DAG of the value corresponding to the key or else null. The value is then read by reading from the output region. The segment is written by writing to a second input region and then invoking an indirect write operation, specifying the two input regions and the output region. There are also instructions to reset a region to the start of a virtual segment, for example the first non-null entry in the virtual segment, and increment to the next entry, allowing the application to effectively iterate over the virtual segment contents.

To support column-oriented representation of a table, a coprocessor 108 in some embodiments supports aggregating regions into an aggregate region that, when incremented, increments each of regions to the next location with a non-default value in at least one of the constituent regions. This supports efficient iteration over a projection of the table onto a subset of the columns, presented as a sequence of records. The coprocessor 108 thus may provide an aggregate region to implements the projection corresponding to the consecutive record representation of the fields at the current iterator location. For example, if the aggregate iterator consists of interators i1, i2 and i3 corresponding to the name, rank and serial number columns of a table, the consecutive record representation is (name_i,rank_i.serialNumber_i) when the corresponding aggregate iterator was located at the i-th entry.

In some embodiments the coprocessor 108 provides notification on changes, in some instances as a queue to each processor. This is provided as a registration mechanism, allowing a processor 102 to receive notifications on commit when a segment changes and the lines that have changed. The registration takes the form of a start-end offset within the region, with instructions to register and deregister for notifications. This notification mechanism is also used to create a reference to a segment, to prevent it from being deallocated or to provide notification when it is to be, depending on whether this is to be flagged as strong or weak reference.

In some embodiments a region 406 is regarded as providing a "view" in the database sense of some value or collection from the state in the structured memory 110 into a physical region 406, thereby presenting it as readable and writable through the conventional memory access. The coprocessor instructions provide a means to perform operations to create these views as well as configure the chip. As such, coprocessor 108 may provide a sophisticated set of database-like operations such as joins or sorts that provide derived views of the data.

In general, the coprocessor 108 is extensible to support a variety of instructions. It may support the specification of multiple instructions per call if there were common multi-instruction sequences identified, to reduce the "issue" overhead. It may also support various configuration and management statistics and operations to configure the chip and query the statistics.

In one embodiment, SITE can include an inter-node communication and optimization. SITE implements a virtual NIC that allows transmission and reception of data between nodes. The key optimization is provided as part of an RDMA capability associated with this transmission.

When data is transmitted from one processor 102 to another, the data is actually transmitted by passing just the root PLID of the DAG corresponding to the data to the receiving processor 102. The receiver then fetches any lines referenced by this root PLID that it does not already have. The resulting segment can then be incorporated into a segment at the receiver's end to make it visible to the receiving node's software, invalidating lines in the receiver's processors as appropriate. Thus, only the minimal amount of data is actually moved, based on lines present in the receiving SITE. If local to the same SITE, no transmission or copying is required at all, relying on the snapshoting capability of the structured memory 110.

One possible RDMA implementation is for a message passed with a field containing a PLID to automatically cause the associated segment to be transmitted as above. For example, the RDMA may be implicitly invoked as a result of attempting to pass a PLID.

In some embodiments, the structured memory 110 provides an instant snapshot locally, allowing the transmission of the snapshot to take place incrementally in small easily switched cell/packet units without suspending the local processing. By contrast, a conventional system has to suspend the processes/processors modifying the segment and then either make a copy of the segment data or else modify the virtual memory system to make this segment copy-on-write. Both are expensive.

The copy-on-write entails setting every page in the non-read-only portion of the address space to copy-on-write and then fielding page faults in software for each subsequent first write access to such a page, copying the page, updating the VM mapping and resuming the process.

As a particular use case, a snapshot of a region 406 can be sent to another SITE. Only the lines not present in the receiving SITE need to be transmitted, not the entire image. For example, a 20 Gbyte snapshot that only differs in 2 megabytes of lines requires at most 2 megabytes of transmission. Moreover, the cost of storing the snapshot at the receiver in addition to the previous snapshot is at most 2 additional megabytes of memory. Finally, there is minimal interference with the execution because a snapshot is created by just creating a separate reference to the current/committed segment. The term "at most" is used above because it is possible that some of those changed lines already occur elsewhere in this snapshot or an earlier retained snapshot, in which case the line is already present at the receiver and thus does not incur extra communication or storage.

In some embodiments, SITE implements this efficient communication by implementing a mapping between the PLIDs on the local node and the remote nodes. The protocol for transmission may follow that of U.S. patent application Ser. No. 12/317,375 which is hereby incorporated by reference in its entirety. For example, if the receiver receives a PLID for which it has no mapping, it requests the line corresponding to this PLID from the sender, recursively until it has received the entire segment.

In summary, a sample API takes virtual memory 402 and maps to physical memory 404 using regions 406 that map to structured memory 110. Examples of instructions include:
- Application read: a direct memory access to structured memory 110;
- Application write: direct memory access to structured memory 110; and
- Coprocessor instructions: for example, create/delete regions, commit, abort, sync, make—inverted-index, and make shared segment.

Figure 5:
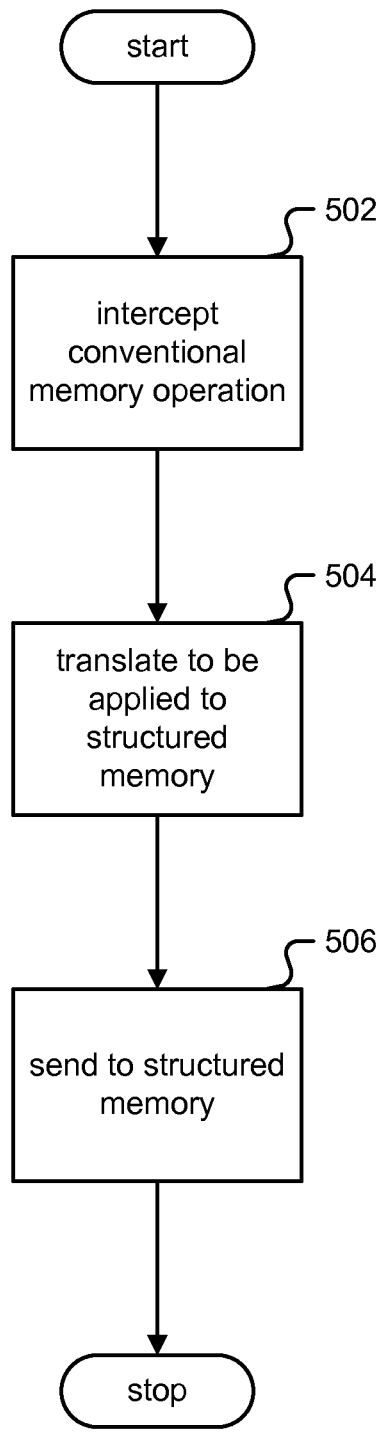
FIG. 5 is a flow chart illustrating a coprocessor operation for sending to a structured memory.

FIG. 5 is a flow chart illustrating a coprocessor operation for sending to a structured memory. In some embodiments, FIG. 5 is implemented in or with coprocessor 108 of FIG. 1. In some embodiments, the operation depicted in FIG. 5 is an operation to write or store data to structured memory.

In step 502, a conventional memory operation for memory 106 is intercepted by coprocessor 108. As described above and in FIG. 4, if PA is the physical address and falls within a region with start address RSA and end address REA, it is mapped to the line at offset O in segment S, where S is the segment for this region, and O is equal to PA-RSA. Thus when processor 102 issues a write/writeback to a physical address in a region, the coprocessor 108 intercepts and interprets the instruction to write the data at the corresponding segment and offset in structured memory 110.

In step 504, the coprocessor 108 translates the conventional memory store operation to be applied to structured memory 110. As described above and in FIG. 4, the translation may include both direct and indirect/associative write operations. For example, with an indirect write of an array of segments, the array entry is read by writing to a first input region starting at offset 0 with the key value. The segment is written by writing to a second input region and then invoking an indirect write operation, specifying the two input regions and the output region. In step 506, the coprocessor 108 sends, writes, stores, and/or commits the translated operations from step 504 to structured memory 110. In various embodiments, the translation is actually applied to the structured memory in this step 504.

Figure 6:
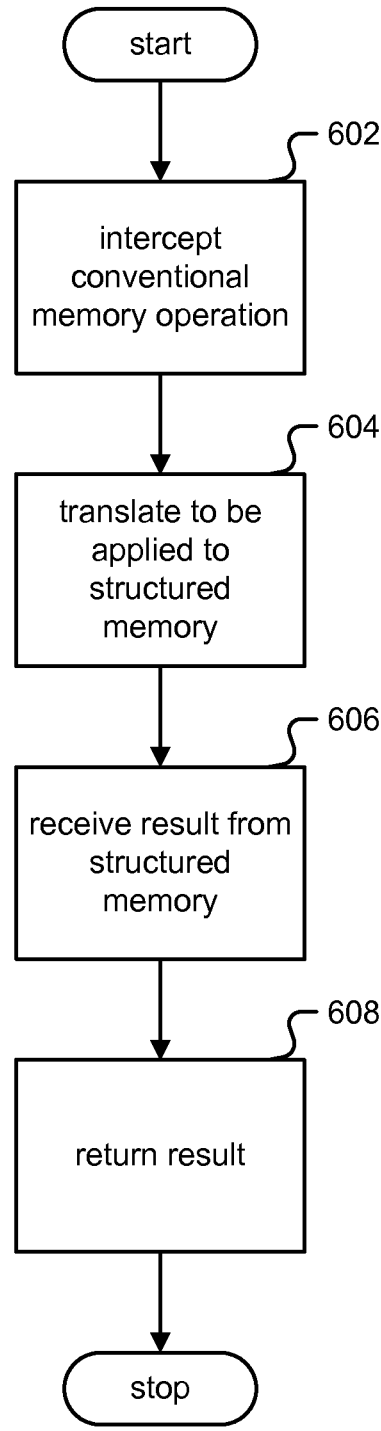
FIG. 6 is a flow chart illustrating a coprocessor operation for reading from a structured memory.

FIG. 6 is a flow chart illustrating a coprocessor operation for reading from a structured memory. In some embodiments, FIG. 6 is implemented in or with coprocessor 108 of FIG. 1. In some embodiments, the operation depicted in FIG. 6 is an operation to read data from a structured memory.

In step 602, a conventional memory operation for memory 106 is intercepted by coprocessor 108. As described above and in FIG. 4, when a processor 102 issues a read from a virtual address 402 that maps to a physical address 404 that maps to a given region 406, the coprocessor 108 responds with the data line in the physical segment and at the offset corresponding to this physical address. In particular, if PA is the physical address and falls within a region with start address RSA and end address REA, it is mapped to the line at offset O in segment S, where S is the segment for this region, and O is equal to PA-RSA.

In step 604, the coprocessor 108 translates the conventional memory store operation to be applied to structured memory 110. As described above and in FIG. 4, the translation may include both direct and indirect/associative read operations. For example, with an indirect read of an array of segments, the array entry is read by writing to a first input region starting at offset 0 with the key value and invoking the indirect read operation specifying the array of segments and the input region as the key. In various embodiments, the translation is actually applied to the structured memory in this step 604.

In step 606, the coprocessor 108 sends and commits the translated operations from step 504 to structured memory 110 and receives a result read from the structured memory 110, which can be read in step 607. For example, the exemplary indirect read instruction causes the output region iterator to be set to the DAG of the value corresponding to the key or else null. The value is then read by reading from the output region.

The coprocessor 108 and structured memory 110 can be used by software for a variety of functions and services.

Snapshot Checkpointing. In some embodiments, a structured memory 110 with coprocessor 108 may support creating a sequence of snapshots of memory, maximizing the sharing between these snapshots as well as compacting within a snapshot based on common data lines, such as zero lines. This capability can be used at a variety of levels.

Processor Checkpoint. In this mode, the entire physical memory of a processor from the OS view is mapped to a structured memory segment. This processor plus segment constitute one logical processing node. Thus, the segment corresponding to the processor memory region can be checkpointed locally or remotely as described above. Then, if the node fails, the processor can be rebooted with the last checkpoint of this memory state, allowing the node to resume.

In some embodiments, the HICAMP deduplication and/or compaction allows a compact representation of multiple checkpoints, automatically sharing duplicates between these snapshots, as well as within each snapshot. The iterator register support allows efficient rereading of a checkpoint when the processor is restarted. It also allows efficient atomic update to create a new checkpoint.

A node segment can be efficiently migrated to another structured memory by utilizing the deduplicated mapping between structured memories, for example just passing a PLID and providing any lines missing at the new structured memory. In this use, software may be required to manage a node in the vein of a management processor that has control over the physical processor and hardware configuration, setting up the regions and handling the checkpointing and rollback/resume of the processor. The software running on the node may be oblivious to these actions although some provision may be required for external actions by the software such as network connections.

Process Checkpoint/Snapshot. A process-level checkpoint/rollback can be provided using a structured memory region for each modifiable segment of the process, including stack and heap, with the process registers stored in the stack. This approach may require modification of the operating system to interface to the coprocessor 108 to create coprocessor 108 segments for each such process, and to interface to the coprocessor 108 as part of the checkpointing and rollback.

This capability is of interest to large-scale scientific distributed parallel computation in some cases, to allow fast restart of a failed application. This capability can also be provided at the level of a memory-mapped region within a process, allowing it to provide application-specific state within this region to be recovered on restart, avoiding the I/O overhead of writing a complete file on each checkpoint. This is also of interest for debugging, being able to rollback a process to an earlier point.

This snapshot capability may also be used to allow a separate concurrent process to "audit" the consistency of the application state without interfering with the execution of the application, yet ensuring corrective actions shortly after an inconsistency is detected.

Virtual Machine Checkpoint. The VM version is similar to above except the virtual machine monitor ("VMM") provides a segment per virtual machine, building on the checkpointing of VMs supported by the existing VMM. The VMM is extended to communicate with the coprocessor 108 to allocate a segment for each VM, actually one per snapshot. Similarly, its Vmove capability is integrated with the coprocessor 108. When a VM fails or need to be rolled back, it is restarted with a previous checkpoint of its state.

As an extension, the VMM can recognize portions of the VM, such as the OS code segment and provide these as separate structured memory segments, reducing the need to maintain coherency state, assuming this code segment is not changed.

The processor 102 still needs to address any associated state that is external to the VM, such as the virtual disk as well as the communication state and external expectations as mentioned above. The solution provides a checkpoint of the virtual disk at the same time. If the virtual disk is provided by FLASH using structured memory segments, all the same mechanisms and benefits described above apply. This case requires modification to the VMM but other software can run without change provided that the VMM handles the external I/O problem.

In various embodiments, a coprocessor provides this structured memory to run virtual machines in a virtualized data center. One key benefit would be reducing the amount of physical memory required, in part because of the structured memory deduplication. In one embodiment, conventional processors could use the coprocessor system as its memory, with the structured aspect using deduplication to reduce DRAM costs and associated power overhead. In one embodiment, the deduplication would also benefit performance by having a cache that may be more efficient as a result of the deduplication.

Optimizations.

The operation with a coprocessor 108 can be optimized to avoid some level of memory traffic going to a processor 102. Each processor 102 can maintain a local DRAM memory of pages that correspond to data in read-only segments. In this case, when a processor 102 issues a read for a page in a read-only segment, the page can be copied to this local DRAM. The segment is then remapped for this physical page so subsequent loads take place from this local DRAM rather than going to the coprocessor 108.

In the case of a segment that can change after a commit, any changed pages are either recopied or remapped to the coprocessor 108 segment. For instance, if a new version of the software is loaded. In the case of changed pages, one can identify the portions that have changed at the line level based on PLIDs, and only copy the portions that have changed. The stack segment can be mapped to this per-processor local DRAM, with suitable modifications to the operating system.

In-Memory Search Engine and Databases. A search engine maintains inverted indexes on terms, for example words or phrases, that map to the set of documents and possibly per-document information such as position or weight. A simplified search is handled by looking up each term of the search phrase in the inverted index and taking the intersection of these results to produce a list of documents containing this search phrase.

A database table is an array/associative array of arrays. Similarly, an index is just an associative array. Thus, an database-like system can be implemented using a structured memory coprocessor 108, providing snapshot isolation, etc. The instruction execution capability of the structured memory coprocessor 108 is used to execute key database operations local to the structured memory coprocessor 108, further improving the performance. For instance, a join is just an iteration of two collections, generating a new collection with the elements having a common key between the two collections.

In this usage, a client process interacts with a shared in-memory database provided by structured memory coprocessor 108 by mapping in an execution context to structured memory coprocessor 108, issuing commands to create regions and reading and writing state in the in-memory database directly through these regions. Thus, a client process has direct memory access to database state, providing much faster access than the conventional approach of communicating with a database server process over a TCP connection, with all the attendant copying and context-switching overhead.

Structured memory coprocessor 108 can provide safely shared structured data among multiple parallel processes with this direct memory access because:

1. the structured data is protected by hardware from arbitrary data structure corruption coming from faulty or compromised application code;
2. structured memory 110 provides snapshots and atomic updates of structured data so a process never sees inconsistent data, even in the present of concurrent updates; and
3. structured memory 110 data segments can be mapped into the application address space, allowing efficient reading and writing of data.

In some embodiments, the space efficiency is improved as well by the memory compaction that structured memory 110 performs using line deduplication. The time performance can also be improved by the off-loading of expensive join and sort operations to the coprocessor 108.

Memcached Implementation. The simplest form of structured data is a key-value pair map, as used by the memcached software, a common mechanism in high-performance web sites. In memcached, the KVP mapping is the primary data structure in space and performance. In a structured memory coprocessor implementation, a virtual segment is allocated to contain this mapping. Each memcached client process is allocated a region corresponding to this virtual segment and maps this into its address space. In addition, it is allocated two input regions, for inputting to this mapping.

On lookup, the client process writes the key to the first input region, and issues an indirect read instruction specifying this input region and the mapping region, and then reads the latter region to retrieve the value. If the value is not found, as indicated by a null value, it writes to the second input and issues an indirect write to cause this value to be added to the map indexed by the specified key. The write can fail if there is a conflict that is unresolvable by merge-update, that is a different value written to the same key index at the same time.

The overall mapping can be partitioned into multiple virtual segments to reduce lookup and update/merge-update overhead. The LRU deletion of map entries can be handled by having a maintenance process. This process creates a duplicate of the primary mapping at the beginning of an "epoch". Then, at the end of the epoch, it iterates over the first mapping, deleting each entry in the primary mapping that corresponds to a non-null entry in the duplicated mapping. Furthermore, each client process writes the i-th entry in the duplicate mapping to 0 when it accesses a key corresponding to this i-th entry. Because repeated accesses to an i-th entry do not change this duplicated mapping, the overhead on the client for this action is small.

In this configuration, a client process cannot compromise or corrupt the KVP mapping any more than it can with the current software implementation because it can only atomically add new entries or delete existing ones. It does not have access to the underling DAG segment structure so cannot corrupt the mapping. Moreover, because of atomic update and the merge-update optimization, multiple processes can update the mapping simultaneously without interfering with concurrent readers and without normally conflicting with each other, a further improvement on the current memcached implementation.

Columnar Database Implementation. In some embodiments, structured memory is particularly amenable to a columnar representation of tables for databases. In columnar representation, a table is a set of arrays, one array per column, storing the field values plus a key index that maps each key to the corresponding offset within the array. The offset is equivalent to a database recordId. Thus, for example, in a database with a classic employee table with record fields corresponding to name, rank and salary, a column representation uses an array of names, an array of ranks and an array of salaries such that the i-th employee information is distributed is stored in name[i], rank[i] and salary[i].

A structured memory coprocessor 108 may provide the benefit of atomic update across the column arrays. It also provides an aggregate iterator register, aggregating an iterator register for each field/column of interest, allowing efficient iteration over the corresponding records.

Inverted Indexes. In some embodiments, structured memory supports an inverted index array, in which an entry contains either an offset, that is an integer, or else a segment of one or more offsets. Logically, it is an array of arrays of integers. We refer to these generically as ids, given the standard approach is to use docIds, wordIds, recordIds in these indexes, or else the equivalent represented by differences as in delta encoding. The tagged structured memory 110 allows an efficient optimization for the common case of there being exactly one value for an entry, for example by storing the id instead of a reference to a segment/array. The deduplication and compaction allows efficient representation of the typically very sparse array representation.

Creating Inverted Indexes. An inverted index can be created by the make-inverted-index command which takes an array and creates an output array which maps each value in the array to its index or indices in the first array.

This instruction is implemented by the coprocessor 108 iterating over the key array R, storing the offset at the entry in the new inverted index array, storing the offset in a segment attached to the entry on collision, as suggested with the pseudocode:

```
for( r in R ) {
    if(RIA[r.val]) {
        if(not segment) {
            tmp = RIA[r.val];
            RIA[r.val] = new Segment
            RIA[r.val].segment append tmp;
            // handle collision.
        }
        RIA[r.val].segment append r.index;
    }
    else RIA[r.val] = r.index;
}
```

Each is an array of integers so deduplication will also provide data compaction.

A structured memory coprocessor 108 may provide other operations to create inverted indexes. For example, it can create an array of offsets that correspond to the non-default values of a specified array. This can be used to transform a document-term matrix to an inverted index. Another is to merge, for example to take the union of two inverted indexes, which entails merging each entry, including merging each entry array, avoiding duplicate values. In some embodiments a structured memory 110 allows duplicate entries and subarrays to be detected efficiently. Similarly, merge by intersection is performed efficiently.

Ordered List of Ids. Id lists used to implement an inverted index array are ordered by integer value in common usage. The basic operations on these ordered lists include inserting, deleting entries plus taking the union, intersection or difference of two arrays of integers, and the negation of an array.

Insertion is complicated by needing to maintain order. Rather than recopying the whole list, the DAG structure of structured memory in some embodiments can be exploited to "expand" the array to introduce extra null entries, for example add an additional level to the DAG where the entries are required. Then, the new entry can be inserted in a newly created location without changing the subsequent ones. A zero entry is skipped as part of iteration so they are innocuous in the middle of an ID list. If using delta encoding, the preceding entry is also changed to reflect the delta to the new next entry. Structured memory 110 in some embodiments can also support a compress operation that squeezes out the null entries where possible. A soft compress does so without changing leaf nodes, i.e. basically the inverse of the expand operation. A hard compress squeezes out all nulls.

The binary operations of union, etc. can be implemented by iteration over the arrays to produce a new array. For example, the following code takes the intersection of A1 and A2 to produce A3:

```
for(a1 in A1, a2 in A2) {
    if(a1.id < a2.id) ++a1;
    else if(a1.id > a2.id ) ++a2;
    else { a3 = a1.id; ++a3; }
}
```

In some embodiments, one can identify common sequences at the sub-DAG level in some cases. In some examples, it is easy to identify if the initial sequence of both A1 and A2 are the same, as might occur if A2 is an update of A1. An intersection is basically a low-level join action. This can be used to handle a conjunction as part of a query.

Contrast to Conventional Inverted Index Representation. A conventional implementation of an inverted index has to implement a map of dynamically growing lists, which typically means a hash table of lists. Thus, each entry in the hash table contains the key, a next pointer and a pointer to the list. The list is either an array which is reallocated and copied when it needs to grow or else a linked list. In either case, there is typically two words or more per entry. On top of this, there is a hash vector that is conventionally allocated to have 4 times as many entries as the expected number in the hash table, to minimize collisions. Thus, each entry in the inverted index costs roughly (3+2+4)*8=72 bytes on a 64-bit machine whereas some structured memory compacts this to 8 bytes or less.

Note that large-scale systems do use in-memory inverted indexes in some cases to augment on-disk indexes to provide for real-time update of indexes. The efficiency of inverted indexes allows them to be created at run-time on demand, used and also produced by a number of operations, as described below.

Selective Projections. In some embodiments, a select-project operation is supported that takes as operands an inverted index as above, and two or more data segments and outputs a result which is the selection and projection of the data segments based on the inverted index. In particular, the command select-project ii,s1,s2;r1,r2->sp is implemented as:

```
j = 0;
for(i in ii ) {
    if(i is segment) {
        for( i2 in i ) {
            sp[j] = s1[i2.offset],s2[i2.offset],r1[*i2],r2[*i2];
            ++j;
        }
    }
    else {
        sp[j] = s1[i.offset],s2[i.offset],r1[*i],r2[*i];
        ++j;
    }
}
```

That is, it produces a projection to a consecutive record representation of the selected fields of s1, s2 and r1 and r2, based on the contents of the inverted index array ii. A restricted version of this operation acts on a single data segment, creating a new array that is simply the selected subsegment of the data segment, either as an "s-selection" based on the entry being non-null (i.e. using the iterator index) or an "r-selection", using the entry value as the selection index.

Note that an inverted index purely created for s-selection can just store 1 or 0 in each entry, and thus compacts to a sparse bitmap representation. Furthermore, a count query can be recorded as an inverted index that degenerates to just a count. A structured memory coprocessor 108 also implements join operations, as described next.

Joins. Consider a join of R and S with fields r and s in R and S, respectively. A join is basically selection with a collection as a key. An equi-join is one in which two tables are joined based on the keys being equal, a common case.

The following equi-join implementations are conventionally called "hash joins". However, in some embodiments because they are implemented using the structured memory array rather than a hash table, we refer to these as indexed-joins. As usual, the lookup is performed on the smaller of the two tables.

Equi-Join To RecordId. A common case is s being a foreign key and the recordId in R, so no separate index is required and the key is unique. For this case, a indexed-join instruction specifies the two input segments, the join keys and the output segment, and SITE performs the join, providing the result in the specified output segment. The indexed-join algorithm is:

```
for(s in S) {
    r = R[s.foreignKey( )]
    construct join tuple [s,r]
}
```

The result array is represented as an inverted index, for example the constructed join tuple [s,r] just entails writing recordId r to a result array at the entry corresponding to the key for that row in S, indicating that the i-th row in S joins to entry r. Multiple joins to row i are represented as a data segment of rowIds at entry i, rather than just a single rowId, as described for inverted indexes above.

Using the resulting inverted index, the conventional join result can be produced by the select-project operation above. In some embodiments the structured memory coprocessor 108 can implement a parallel join by partitioning S into k partitions, with each internal task iterating over a separate partition.

Equi-Join to Other Fields. The structured memory coprocessor 108 needs to be first instructed to construct an inverted index that maps the key to the corresponding recordId in the other table, i.e. create an index on the specified key. Call this sparse array RIA for R index array. Then, an indexed-join-dup instruction can be issued to the coprocessor 108 to perform the join, similar to previously, but this time allowing for duplicates, as illustrated below.

```
for(s in S) {
    ri = RIA[s.foreignKey( )]
    if( ri is segment ) }
        for(each ri' in ri) {
            construct join s,R[ri'];
        }
    }
    else construct join s,R[ri];
}
```

If there are a large number of s's relative to r's, most of the time is spent iterating over s's and looking up r's. If there are a large number of r's, most of the time is spent iterating over the r's, constructing the joins.

Note that building an index is essentially one extra/preprocessing pass over R to avoid repeated passes over R as part of join. The above can also be used for an anti-join, selecting those not in the other table, with simple change to the above logic.

Non-Equi Joins. If both indexes are sorted, a non-equi-comparative or non-equi-range join can be efficiently done with incremental simultaneous iteration over both collections, taking advantage of the indexes being sorted to avoid quadratic cost. For example, if one is joining based on a range, it is clear in one iteration when the key value has entered and when it has left the specified range because of the sorted property of the index. In some embodiments, the structured memory coprocessor 108 supports the usual relational operators as well as a range specification, matching SQL requirements. Absence these sorted indexes, they can created using other coprocessor instructions, as discussed next.

Generating a Sorted Index for 64-Bit or Less Numeric Keys. For these numeric keys, assuming a normal ordering defined on these keys, a sorted index can be generated by storing the recordId/offset of the i-th entry in the table at the offset in the sorted index segment corresponding to the key K of the i-th entry. Then, iteration over the sorted index segment produces the recordIds in order defined by the keys. This is a version of radix sort and produces the same inverted index as described earlier.

In some cases, key segments that are not numeric or that have a different ordering than the normal numeric ordering can be identified by VSIDs that are allocated according to the ordering on these key values. I.e. VSID1<VSID2 if the corresponding key value kv1 is less than kv2. Then, the same radix approach can be used to produce the sorted index. Note: the expand mechanism cannot be used here because that effectively changes the VSID assignment.

Generating a Sorted Index for Other Keys. A sort can be performed by a variant of quick-sort, described initially below for a HICAMP binary tree for simplicity. One picks a 1st pivot P1 and an expansion factor EF for a table T of R records. One then writes a new/to-be-sorted index array SIA where the i is written to SIA into the range [0: EF*R/2] if the join key at T[i].r<P1 and otherwise into the range [EF*R/2: EF*R]. Assume indexing starting from 1 to allow 0 to be used as a null index. In effect, after a first iteration, SIA is the partitioned, partially sorted version of an sorted index into T. The expansion factor of greater than 1 is chosen to allow the pivot P1 to be somewhat off middle and still, with high probability, be able to fit all the values in their designated range. Effectively, the values are properly partitioned between the left and right subtrees of the DAG, allowing each sub-DAG to then be sorted independently to produce an, and in some examples potentially sparse because of EF, array that is a sorted index of the table by the specified key. If a K-ary tree, one picks K–1 pivot points and performs the corresponding partitioning. Within the selected sub-DAG, one can heuristically estimate the entry to pick based on the value of the key relative to the pivots. On selecting a location already occupied with a value, the algorithm can reselect a location up or down from there, possibly comparing to the key value stored at that location.

If a sub-DAG ends up being too small to contain all elements in its pivot range, the sub-DAG can be doubled in size, along with all its peers, adding a new root node to this sub-DAG and effectively pushing it down one level in the result DAG. Another comparable action is to split the sub-DAG while creating this additional level, so the right sub-DAG of the sub-DAG is part of the new right sub-DAG and correspondingly for the left sub-subDAG. This effectively increases the expansion factor dynamically as necessary during the sort phase.

This algorithm benefits from, for example, a multi-path iterator register. Alternatively, there can be an iterator register for each result sub-DAG, so different partitions are in different iterator registers. The segments of each iterator register are merged once the sort of each is completed. Also, there may be corresponding pivots generated for each sub-DAG, allowing further partitioning into the proper sub-sub-DAGs. In some embodiments, the coprocessor 108 rearranges the sub-DAGs at the root relative to further down.

An array SKA of the key values can be created in sorted order at the same time so the key for row i from T is written to SKA[j] if SIA[j] is written to i. This allows efficient iteration over SIA to check for proper sorting, being able to compare the keys by a separate iterator pointing to SIA, avoiding the random access to T that would otherwise be required to retrieve the key values. This is also important for the join operation itself.

In summary, a structured memory coprocessor 108 may support an efficient generation of a sorted index and sorted key array, which can then be used for non-equi joins as above. By restricting these operations to in-memory data, the elapsed time for any of the above operations should be relatively short, in the microseconds to milliseconds range. Ideally, a coprocessor 108 can process multiple independent instructions in parallel with efficient multiple cores of execution. There may be a 1000-fold improvement in performance of even an FPGA coprocessor 108 over the conventional software implementation.

Stream Processing. In some embodiments, structured memory 110 can provide benefits when there is a sliding window, by providing deduplication between the multiple queues making up the different slices of the window, for example there are entries in common between slice at time t1 and time t2.

Indirect Join. In some embodiments, an indirect join instruction is provided as follows:

```
for(s in S) {
    ri = RIA[s.foreignKey( )]
    if( ri is segment ) }
        for(each ri' in ri) {
            construct join s,R[ri'];
        }
    }
    else construct join s,R[ri];
}
```

Checkpointing the Database. In some embodiments, the checkpointing capabilities described earlier can be used to checkpoint the database efficiently, either to a remote node over the network connection or to FLASH.

Full Database Implementation. Using a structured memory coprocessor 108, an in-memory database service could be provided to clients that appears functionally the same as a conventional SQL database by providing a client library that parses and optimizes queries, mapping to the above operations, issuing these operations to the coprocessor 108 and retrieving the results. For example, the MySql client library API could be modified to use the coprocessor 108 in this way, for example using library code 310. Thus, with suitable runtime support, client code 302 perceives no difference except for a faster response.

Multiprocessor Simulation. Here, an application is designed to work from the previous snapshot state to produce a new version of the state, This state needs to mimic FLIP-FLOP semantics because the old state is a snapshot that needs to atomically change to the new state on each simulated clock cycle. Each process sees the previous version of its input data and writes a new version of its output data until a boundary point. Then, the output data is committed and input data is resynch'ed to the atomically updated new state in preparation for the next round.

To implement these semantics, the application reads from the previous snapshot and performs updates to the new version, in a separate segment. At a barrier sync point or similar, it commits the changes and produces a new snapshot which it then proceeds to modify again. This is realized as two virtual address regions in the process address space: one for the previous version of the state and for the new version of the state. The previous version is mapped read-only to a region 406 representing the old state associated with a virtual segment VS. The new version is provided in a virtual address region that is mapped read-write to a region 406 associated with VS. Then, at the beginning of each "round", a process synchs each read-only segment it has mapped; at the end of each round, it commits each segment that it writes.

The process address space can also contain several other segments which are read-only. On barrier, these are updated to the versions of each committed by the other nodes.

In a conventional implementation, the barrier event causes setting the new segment into read-only, and creating the current segment from this read-only segment, flagging it with copy-on-write on each page. Thus, each write to a page causes a page trap, copy/remap and resumption of the process. Also, snapshots only share pages that were not modified at the page granularity, in contrast to the line granularity sharing with the structured memory coprocessor/system.

If segments are shared between process address spaces, to avoid addressing inconsistencies, each shared segment is mapped to the same start address in each address space participating in the application. In this vein, it is necessary to partition the objects into local and shared, where shared objects only contain pointers to other shared objects. Local objects may point to either. The following table attempts to illustrate that:

|  | A |  |
|---|---|---|
|  | B |  |
|  | C |  |
| Local0 | Local1 | Local2 |

Three processes 0, 1 and 2 share segments A, B and C, plus each have their own local segment, Local0, Local1 and Local2. An address in A can refer to an object in B or C, but not one in the local segment, given it does not have a consistent interpretation in each process. Conversely, an object in Local0 segment can refer to any of A, B or C-resident objects as well as other objects in Local0.

This scenario motivates the need for callbacks/notifications in response to changes to objects in the shared segments.

In some embodiments the structured memory coprocessor 108 can provide hardware-supported notification, for example a queue of addresses that software then maps to notification lists at the software level, indicating the object and attribute that changed.

Sparse Matrices. Sparse matrices can be represented in the non-zero dense ("NZD") format as described in U.S. Provisional Patent Application 61/281,417 and hereby incorporated by reference in its entirety. In some embodiments, each matrix is mapped to a region 406, relying on structured memory 110 such as HICAMP to deduplicate repeated entries. This provides significant compaction over a conventional approach. Note that the symmetric quad-tree format ("QTS") bit matrix is effectively a selection bitmap, similar to the selection/inverted indexes used with database operations.

The alternative of programming sparse matrices as dense, but mapped to segments, may be less efficient because the non-zero element locations are then not known to the application software, leading to excessive time complexity and cache loading of zeros. For some matrix computations, it is feasible to parallelize the computation, relying on the fact that no two processes actually modify exactly the same memory location in each round. In this case, the segment can be realized as merge-update, causing the changes to be merged while not incurring the cost of coherency conflicts otherwise caused by false sharing.

This usage requires operating system modifications to allow applications to instantiate memory-mapped regions that map to a structured memory, for example, a HICAMP segment, and the commit, abort and merge-update these segments. These are extensions of the existing shared memory segment facility and/or so-called Linux mmap facility. For instance, one can extend Linux shared memory segments to allow them to be optionally instantiated in a SITE region 406 associated with a virtual segment. These segments would automatically be "private" in Linux terminology. Then, a new operation could be added to merge a private segment/SITE region 406 to that "shared" version.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A computer system comprising:
    an interconnect;
    a processor coupled to the interconnect, wherein the processor requests a memory operation corresponding to a conventional memory over the interconnect; and
    a coprocessor coupled to the interconnect, wherein:
        the coprocessor is associated with a structured memory;
        the coprocessor intercepts the requested memory operation and translates the requested memory operation to be applied to the structured memory.

2. A computer system as recited in claim 1, further comprising a conventional memory coupled to the interconnect.

3. A computer system as recited in claim 1, wherein the requested memory operation is addressed within a mapped region.

4. A computer system as recited in claim 1, wherein the requested memory operation is addressed within a physical address region associated with the coprocessor.

5. A computer system as recited in claim 1, wherein the requested memory operation is addressed within a physical address region associated with the coprocessor, specified by a developer.

6. A computer system as recited in claim 1, wherein the requested memory operation is addressed within a physical address region associated with the coprocessor, specified by an operating system.

7. A computer system as recited in claim 1, wherein the requested memory operation is addressed within a physical address region associated with the coprocessor, transparent to a developer.

8. A computer system as recited in claim 1, wherein the interconnect is a coherent memory bus.

9. A computer system as recited in claim 1, wherein the requested memory operation comprises an indirect read or an indirect write.

10. A computer system as recited in claim 1, wherein the requested memory operation comprises an atomic update operation.

11. A computer system as recited in claim 1, wherein the requested memory operation represents a key-value pair lookup.

12. A computer system as recited in claim 1, wherein the structured memory is hierarchical.

13. A computer system as recited in claim 1, wherein the structured memory is immutable.

14. A computer system as recited in claim 1, wherein the structured memory is deduplicated.

15. A computer system as recited in claim 1, wherein the structured memory is content addressable.

16. A computer system as recited in claim 1, wherein the structured memory provides snapshot checkpointing.

17. A computer system as recited in claim 1, wherein the structured memory represents a database.

18. A computer system as recited in claim 1, wherein the structured memory represents a snapshot of state for lock-free execution.

19. A computer system as recited in claim 1, wherein the structured memory represents an inverted index.

20. A computer system as recited in claim 1, wherein the structured memory represents a sparse matrix.

21. A computer system as recited in claim 1, wherein the coprocessor and structured memory represent a memcached server to the processor.

22. A computer system as recited in claim 1, wherein the coprocessor and structured memory represent a search engine to the processor.

23. A computer system as recited in claim 1, wherein the coprocessor is further configured to return to the processor a result of the translated memory operation applied to the structured memory.

24. A computer system as recited in claim 1, wherein the memory operation is a writing operation and the coprocessor applies the writing operation to a transient line before committing the writing operation to the structured memory.

25. A computer system as recited in claim 1, wherein the coprocessor includes a cache memory.

26. A method comprising:
intercepting a requested memory operation corresponding to a conventional memory; and
translating the requested memory operation to be applied to a structured memory.

27. A method as recited in claim 26, wherein the requested memory operation is addressed within a mapped region.

28. A method as recited in claim 26, wherein the requested memory operation comprises an atomic update operation.

29. A method as recited in claim 26, wherein the requested memory operation represents a key-value pair lookup.

30. A method as recited in claim 26, wherein the structured memory is hierarchical.

31. A method as recited in claim 26, wherein the structured memory is immutable.

32. A method as recited in claim 26, wherein the structured memory is deduplicated.

33. A method as recited in claim 26, wherein the structured memory is content addressable.

34. A method as recited in claim 26, wherein the structured memory provides snapshot checkpointing.

35. A method as recited in claim 26, wherein the structured memory represents a database.

36. A method as recited in claim 26, wherein the structured memory represents a snapshot of state for lock-free execution.

37. A method as recited in claim 26, wherein the structured memory represents an inverted index.

38. A method as recited in claim 26, wherein the structured memory represents a sparse matrix.

39. A method as recited in claim 26, further comprising returning a result of the translated memory operation applied to the structured memory.

40. A method as recited in claim 26, wherein the requested memory operation is a writing operation and further comprising applying the writing operation to a transient line before committing the writing operation to the structured memory.

* * * * *